(12) United States Patent
Jeong

(10) Patent No.: US 9,541,779 B2
(45) Date of Patent: Jan. 10, 2017

(54) DISPLAY DEVICE INCLUDING A CURVATURE MAINTAINING BAR

(71) Applicant: SAMSUNG DISPLAY CO., LTD., Yongin-si, Gyeonggi-do (KR)

(72) Inventor: Weejoon Jeong, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 61 days.

(21) Appl. No.: 14/702,071

(22) Filed: May 1, 2015

(65) Prior Publication Data

US 2016/0143161 A1 May 19, 2016

(30) Foreign Application Priority Data

Nov. 14, 2014 (KR) ........................ 10-2014-0158870

(51) Int. Cl.
| | | |
|---|---|---|
| H05K 1/02 | (2006.01) | |
| G02F 1/1333 | (2006.01) | |
| H05K 7/14 | (2006.01) | |
| G09F 15/00 | (2006.01) | |
| H05K 5/00 | (2006.01) | |

(52) U.S. Cl.
CPC ............ *G02F 1/1333* (2013.01); *H05K 1/028* (2013.01); *H05K 7/14* (2013.01); *G09F 15/0031* (2013.01); *H05K 5/0017* (2013.01)

(58) Field of Classification Search
CPC ........ H05K 1/028; H05K 5/0017; H05K 7/14; G02F 1/1333; G09F 15/0031
USPC ... 361/749, 752, 679.21, 679.04; 349/58, 61
See application file for complete search history.

(56) References Cited

U.S. PATENT DOCUMENTS

| | | | |
|---|---|---|---|
| 9,116,662 B1* | 8/2015 | Song | G06F 1/1601 |
| 2012/0281367 A1* | 11/2012 | He | H05K 5/02 |
| | | | 361/728 |
| 2013/0002572 A1 | 1/2013 | Jin et al. | |
| 2013/0329162 A1* | 12/2013 | Fujii | H05K 7/14 |
| | | | 349/58 |
| 2014/0009914 A1 | 1/2014 | Cho et al. | |
| 2014/0118910 A1* | 5/2014 | Sung | G09F 9/301 |
| | | | 361/679.01 |
| 2014/0168564 A1 | 6/2014 | Lee et al. | |
| 2014/0247566 A1 | 9/2014 | Lee et al. | |
| 2014/0354519 A1* | 12/2014 | Lee | G09F 9/301 |
| | | | 345/76 |

(Continued)

FOREIGN PATENT DOCUMENTS

| | | |
|---|---|---|
| JP | 2013-134295 | 7/2013 |
| KR | 1020130007312 | 1/2013 |

(Continued)

*Primary Examiner* — Adrian S Wilson
*Assistant Examiner* — Abhishek Rathod
(74) *Attorney, Agent, or Firm* — F. Chau & Associates, LLC

(57) ABSTRACT

A display device includes a display panel, a bottom case, and a curvature maintaining bar. The display panel has a first curvature. The display panel is disposed in the bottom case. The bottom case has a locking projection and a second curvature substantially a same shape or radius as that of the first curvature. The curvature maintaining bar is coupled to the locking projection. The curvature maintaining bar includes a first protrusion. The bottom case has a coupling hole into which the first protrusion is inserted.

14 Claims, 8 Drawing Sheets

(56) References Cited

U.S. PATENT DOCUMENTS

2015/0009635 A1* 1/2015 Kang .................. G09F 9/301
                                                          361/749

FOREIGN PATENT DOCUMENTS

| KR | 1020130070423 | 6/2013 |
| KR | 1020140007202 | 1/2014 |
| KR | 1020140059930 | 5/2014 |

* cited by examiner

DISPLAY DEVICE INCLUDING A CURVATURE MAINTAINING BAR

CROSS-REFERENCE TO RELATED APPLICATION

This application claims priority under 35 U.S.C. §119 to Korean Patent Application No. 10-2014-0158870, filed on Nov. 14, 2014, in the Korean Intellectual Property Office, the disclosure of which is incorporated by reference herein in its entirety.

TECHNICAL FIELD

Exemplary embodiments of the present invention relate to a display device, and more particularly, to a display device including a curvature maintaining bar.

DISCUSSION OF RELATED ART

Depending on locations at which a viewer sees a screen of a display device or on positions (e.g., a central portion or left and right end portions) of the screen which the viewer sees, a visual disparity may occur. The visual disparity may become larger as the screen size of the display device is increased.

To compensate for the visual disparity, a curved display device, of which a surface is concavely or convexly curved, may be used. The curved display device may include a portrait type device and a landscape type device. The portrait type device has a longer vertical length than a horizontal length from the viewpoint of a viewer and is curved in a vertical direction. The landscape type has a longer horizontal length than a vertical length from the viewpoint of a viewer and is curved in a horizontal direction.

An L-shaped curvature maintaining bar may be disposed on an exterior surface of a frame structure (e.g., a bottom case) of the curved display device to maintain a curvature thereof.

SUMMARY

According to an exemplary embodiment of the present invention, a display device is provided. The display device includes a display panel, a bottom case, and a curvature maintaining bar. The display panel has a first curvature. The display panel is disposed in the bottom case. The bottom case has a locking projection and a second curvature having substantially a same shape or radius as that of the first curvature. The curvature maintaining bar is coupled to the locking projection. The curvature maintaining bar includes a first protrusion. The bottom case has a coupling hole into which the first protrusion is inserted.

The bottom case may include a bottom portion and a sidewall portion bent from the bottom portion. The locking projection may extend from a surface of the bottom portion. The bottom portion may have the coupling hole.

The curvature maintaining bar may have a third curvature having substantially the same shape or radius as that of the first curvature. The curvature maintaining bar may be in contact with the bottom portion.

The curvature maintaining bar may further include a base portion. The first protrusion may protrude from a surface of the base portion.

The base portion may be coupled to the locking projection.

The base portion may be in contact with the bottom portion of the bottom case.

The curvature maintaining bar may be disposed substantially parallel to a long side or a short side of the bottom case.

The display device may further include a screw configured to fasten the curvature maintaining bar to the bottom portion of the bottom case.

The curvature maintaining bar may further include a base portion. The bottom case may further include a guide portion bent from the bottom portion.

The guide portion may be in contact with the base portion. The guide portion may have the coupling hole.

The bottom portion and the guide portion may be integrated with each other.

According to an exemplary embodiment of the present invention, a display device is provided. The display device includes a display panel, a bottom case, and a curvature maintaining bar. The display panel has a first curvature. The display panel is disposed in the bottom case. The bottom case has a locking projection and a second curvature having substantially a same shape or radius as that of the first curvature. The curvature maintaining bar is coupled in a sliding manner to the locking projection.

The bottom case may include a bottom portion and a sidewall portion bent from the bottom portion. The locking projection may extend from a surface of the bottom portion.

The curvature maintaining bar may have a third curvature having substantially the same shape or radius as that of the first curvature. The curvature maintaining bar may be in contact with the bottom portion.

The curvature maintaining bar may be disposed substantially parallel to a long side or a short side of the bottom case.

According an exemplary embodiment of the present invention, a display device is provided. The display device includes a display panel, a bottom case, and a curvature maintaining bar. The display panel has a first curvature. The display panel is disposed in the bottom case. The bottom case has a locking projection, a guide portion bent from a bottom portion of the bottom case, and a second curvature having substantially a same shape or radius as that of the first curvature. The curvature maintaining bar is coupled to the locking projection. The curvature maintaining bar includes a first protrusion and a base portion. The guide portion is in contact with the base portion.

The guide portion may have a coupling hole into which the first protrusion is inserted.

The locking projection may have a hook shape.

The curvature maintaining bar may be disposed substantially parallel to a long side or a short side of the bottom case.

The locking projection may extend from a surface of the bottom portion.

BRIEF DESCRIPTION OF THE DRAWINGS

The above and other features of the present invention will be more clearly understood from the following detailed description taken in conjunction with the accompanying drawings, in which.

DETAILED DESCRIPTION OF THE EMBODIMENTS

Figure 1:
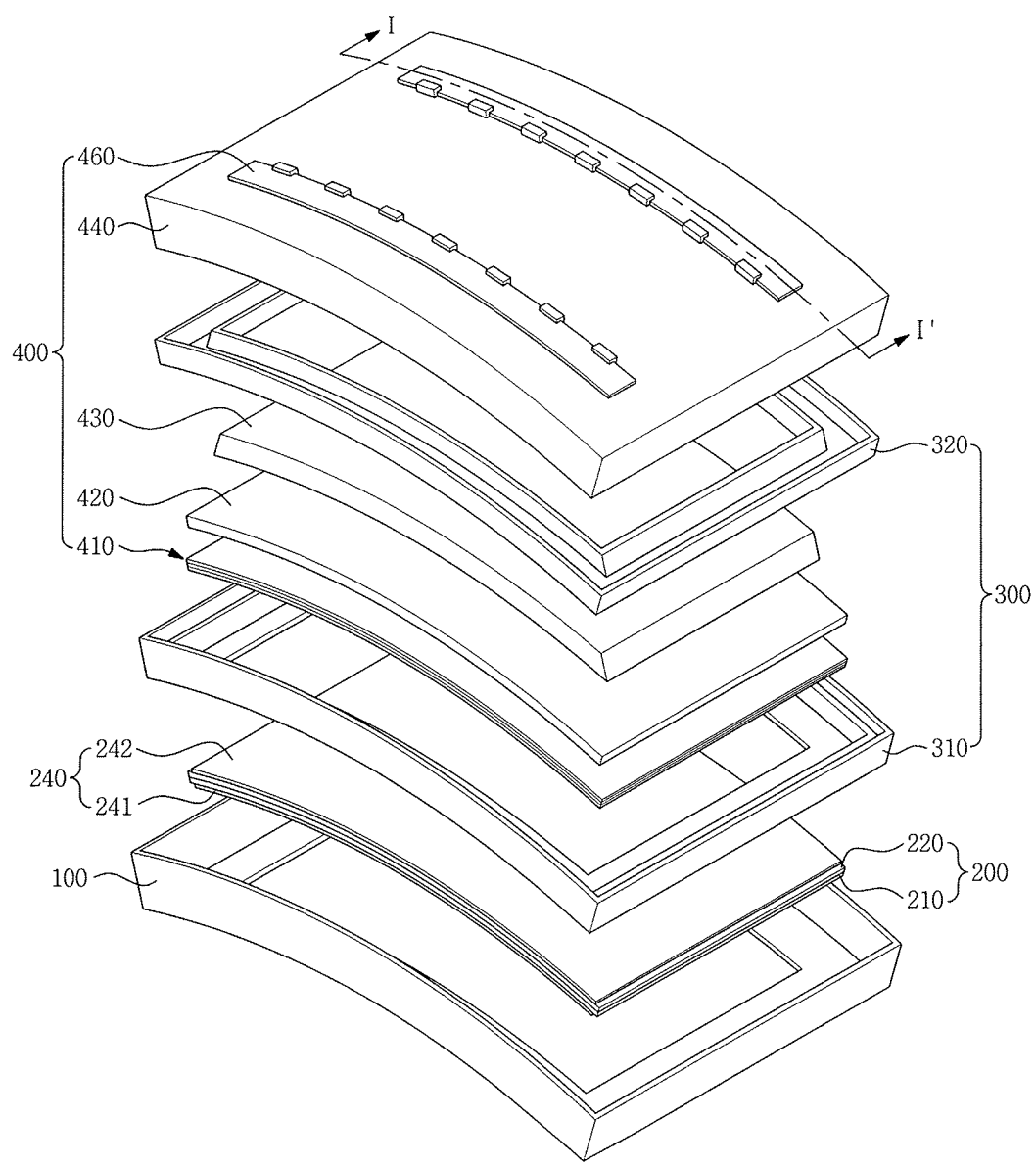
FIG. 1 is an exploded perspective view illustrating a display device according to an exemplary embodiment of the present invention.

Exemplary embodiments of the present invention will be described in detail with reference to the accompanying drawings. The present invention may, however, be embodied in many different forms and should not be construed as being limited to the exemplary embodiments set forth herein. Like reference numerals may refer to like elements throughout the specification.

Hereinafter, a display device according to an exemplary embodiment of the present invention will be described with reference to FIGS. 1 and 2.

FIG. 1 is an exploded perspective view illustrating a display device according to an exemplary embodiment of the present invention. FIG. 2 is a cross-sectional view of the display device illustrated in FIG. 1, which is taken along line I-I' of FIG. 1.

Figure 2:
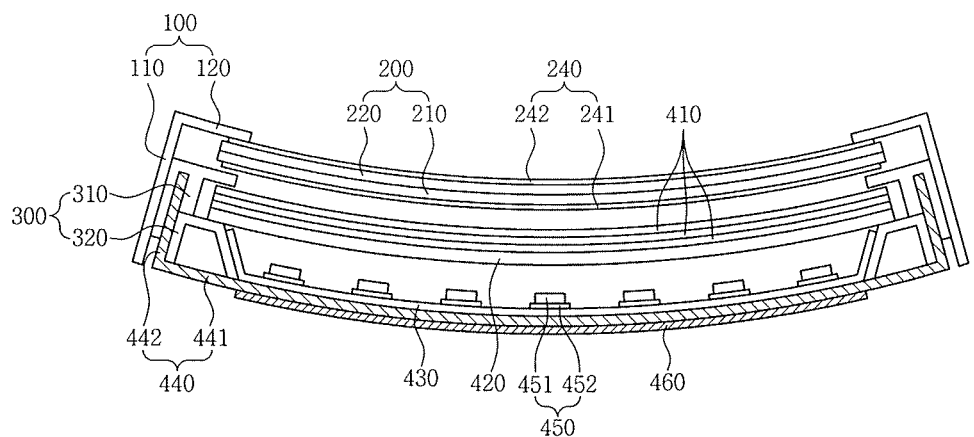
FIG. 2 is a cross-sectional view of the display device illustrated in FIG. 1, which is taken along line I-I' of FIG. 1.

Referring to FIGS. 1 and 2, the display device according to an exemplary embodiment has a predetermined radius of curvature. For example, the display device may be a curved display device of which a surface is curved in an arc shape extending from a central portion of a display panel 200 to opposing sides thereof.

The display device may include the display panel 200, a backlight assembly 400 configured to emit light to the display panel 200, a top case 100 surrounding (e.g., overlapping) the display panel 200, and a mold frame 300. The display panel 200 may be seated on the mold frame 300. The above enumerated components (e.g., the display panel 200, the top case 100, the mold frame 300) may be curved to fit the overall curved surface of the display device.

The top case 100 may be coupled to a bottom case 440 to cover the display panel 200 seated on the mold frame 300. The top case 100 may have an open window in a central portion thereof to expose the display panel 200. The top case 100 may be disposed to cover an upper edge portion and/or a side surface of the display panel 200.

The top case 100 may include a side portion 110 that covers (e.g., overlaps) a side surface of the display panel 200 and include a cover portion 120 bent from the side portion 110 to cover (e.g., overlap) an upper edge portion of the display panel 200.

The top case 100 may be coupled to the bottom case 440 using hooks and/or screws. The top case 100 and the bottom case 440 may be coupled to each other through various methods and/or mechanisms.

The display panel 200 may have a predetermined radius of curvature. The display panel 200 may include a flexible material. The display panel 200 may be curved after being disposed on the bottom case 440, the mold frame 300, and the top case 100. For example, the bottom case 440, the mold frame 300, and the top case 100 may fix the display panel 200 so that the display panel 200 can have a predetermined radius of curvature. Therefore, the bottom case 440, the mold frame 300, and the top case 100 may have a predetermined radius of curvature which is similar in form to that of the display panel 200.

The display panel 200 may be curved in various manners. In an exemplary embodiment of the present invention, when an image is displayed in an upper direction of the display panel 200 and the opposing direction of the display panel 200 refers to a lower direction, the display panel 200 may be convexly curved in the upper or lower direction. However, the direction in which the display panel 200 is curved is not limited thereto. In an exemplary embodiment of the present invention, a central portion of the display panel 200 may be convexly curved in the upper direction. For example, the display panel 200 may be convexly curved towards a user. In an exemplary embodiment of the present invention, one part of the display panel 200 may be convexly curved in the upper direction and other part of the display panel 200 may be convexly curved in the lower direction.

The display panel 200 may display an image. The display panel 200 may be a light receiving display panel. The display panel 200 may include a liquid crystal display (LCD) panel, an electrowetting display panel, an electrophoretic display panel, a microelectromechanical systems (MEMS)-based display panel, or the like. In an exemplary embodiment of the present invention, the display panel 200 may be the LCD panel.

The display panel 200 may have a quadrangular plate shape that has two pairs of parallel sides. According to an exemplary embodiment of the present invention, the display panel 200 may have a rectangular shape that has two long sides and two short sides. The display panel 200 may include a first substrate 210, a second substrate 220 facing the first substrate 210, and a liquid crystal layer disposed between the first and second substrates 210 and 220. The display panel 200 may include a display area that displays an image and a non-display area that surrounds the display area. The non-display area does not display an image when viewed from the top. The non-display area may be covered with the top case 100.

The first substrate 210 may include a plurality of pixel electrodes and a plurality of thin film transistors (TFTs) that may be electrically connected to a corresponding one of the pixel electrodes. Each TFT may provide a drive signal to its corresponding pixel electrode. The second substrate 220 may include a common electrode that generates an electric field in conjunction with the pixel electrodes to control arrangements of liquid crystal molecules in the liquid crystal layer. The display panel 200 may include a liquid crystal layer that projects an image forward.

The display panel 200 may include a driver chip (e.g., a driver circuit) configured to supply drive signals, a tape carrier package (TCP) in which the driver chip is mounted, and a printed circuit board (PCB) which is electrically connected to the display panel 200 through the TCP. The driver chip may produce drive signals to drive the display panel 200 in response to external signals. The external signals may be supplied from the PCB. The external signals may include image signals, control signals, and drive voltages.

A polarizer 240 may be disposed on the display panel 200. The polarizer 240 may include a first polarizer 241 and a second polarizer 242. The first and second polarizers 241 and 242 may be respectively disposed on opposite surfaces of the first and second substrates 210 and 220. The first polarizer 241 may be disposed on an exterior side (e.g., a lower surface) of the first substrate 210 and the second polarizer 242 may be disposed on an exterior side (e.g., an upper surface) of the second substrate 220. A transmission polarization axis of the first polarizer 241 may be substantially orthogonal to a transmission polarization axis of the second polarizer 242.

The mold frame 300 may be coupled to the bottom case 440. The mold frame 300 may accommodate the display panel 200. The mold frame 300 may include a flexible material, such as plastic, or the like, and thus, may reduce or prevent damage to the display panel 200. However, the present invention is not limited thereto. The mold frame 300 may include different materials that have substantially the same shape and function as the flexible material.

In an exemplary embodiment of the present invention, the mold frame 300 may include an upper mold 310 configured to support the display panel 200, and a lower mold 320 configured to support a diffuser plate 420 and an optical sheet 410. In an exemplary embodiment of the present invention, the mold frame 300 may include only the upper mold 310, and the diffuser plate 420 and the optical sheet 410 may be supported by the bottom case 440.

The mold frame 300 may be disposed along edges of the display panel 200. The mold frame 300 may support the display panel 200 under the display panel 200. The mold frame 300 may be disposed in a place corresponding to four sides of the display panel 200 or may be disposed in a place corresponding to at least part of the four sides of the display panel 200. In an exemplary embodiment of the present invention, the mold frame 300 may have a shape of a quadrilateral loop corresponding to the four sides of the display panel 200, or may have an opening corresponding to one side selected from the edges of the display panel 200. The mold frame 300 may be integrally formed as one single structure or may be provided in plural and assembled.

In addition, the mold frame 300 may be coupled to the top case 100. In an exemplary embodiment of the present invention, a screw hole may be formed in the top case 100, the bottom case 440, and the mold frame 300, and the top case 100, the bottom case 440, and the mold frame 300 may be simultaneously coupled using a screw (e.g., the screw hole). For example, the top case 100, the bottom case 440, and the mold frame 300 may be coupled to each other in various manners and may thus be fixed to each other.

The backlight assembly 400 may include the optical sheet 410 (or a plurality of optical sheets 410), the diffuser sheet 420, a reflective sheet 430, the bottom case 440, and a light source unit 450.

The light source unit 450 may include a light source 451 and a circuit board 452 on which the light source 451 is disposed. The light source unit 450 may be disposed under the display panel 200. For example, the light source unit 450 may be disposed on a bottom surface of the reflective sheet 430 or may be disposed on a bottom surface of the bottom case 440.

The circuit board 452 may be curved in the cross-sectional view of FIG. 2. The circuit board 452 may have a quadrangular shape (e.g., a rectangle) and may have a reflective surface. In an exemplary embodiment of the present invention, a surface of the circuit board 452 may include a reflective material. Further, the circuit board 452 may include a metal material to perform heat dissipation. However, the metal material in the circuit board 452 is not limited, and various metal materials with high thermal conductivity may be used.

The circuit board 452 may include at least one mounting area and a conductive line area. When the light source unit 450 includes at least two light sources 451, the circuit board 452 may include at least two the mounting areas, and thus, one light source 451 is disposed in each mounting area, and a plurality of conductive lines may be disposed in the conductive line area to transmit driving power to the light sources 451. A power for driving the light sources 451 may be generated in an external power supply unit and may be supplied to the plurality of conductive lines through a separate connector.

The light source 451 may include a light emitting diode (LED), or the like. A plurality of light sources 451 may provide light so that a display device may display image information. Light emitted from the light source 451 may be guided towards the display panel 200 through the diffuser plate 420 and the optical sheet 410. For uniformity in luminance of the light source unit 450, the light sources 451 may be spaced apart from each other by a predetermined distance. In an exemplary embodiment of the present invention, the light sources 451 may be equally spaced apart from each other in a first direction (e.g., a horizontal direction) and a second direction (e.g., a vertical direction) substantially perpendicular to the first direction to be disposed in a matrix form. Further, the light sources 451 may be aligned with each other in the second direction (e.g., the vertical direction) and may be arranged in a zigzag manner in the first direction (e.g., the horizontal direction). In an exemplary embodiment of the present invention, the light sources 451 may be aligned with each other in the first direction (e.g., the horizontal direction) and may be arranged in a zigzag manner in the second direction (e.g., the vertical direction). However, exemplary embodiments of the present invention are not limited thereto. To obtain uniformity in luminance, the light sources 451 may be arranged in various manners on the circuit board 452. Further, a coupling hole into which a coupling member is inserted and fixed may be defined in the circuit board 452.

The light source 451 may be an LED package that includes an LED. In an exemplary embodiment of the present invention, one LED package may include a red LED generating and emitting red light, a green LED generating and emitting green light, and a blue LED generating and emitting blue light. The LED package may produce white light by combining (or mixing) three colors (e.g., the red, green, and blue colors). In an exemplary embodiment of the present invention, the LED package may include only the blue LED among the LEDs of the three colors, and a phosphor may be disposed in a light emitting unit of the blue LED to convert the generated blue light to white light. Light emitted from the light source 451 may be incident on the diffuser plate 420.

The diffuser plate 420 may be disposed on the light source unit 450. As illustrated in FIGS. 1 and 2, the diffuser plate 420 may have a shape of polyhedron having a curved surface. The diffuser plate 420 may include a flexible material, which is similar to the display panel 200. For example, the diffuser plate 420 may initially have a shape that is substantially flat and may be deformed into a curved shape when finally included in a display device. In an exemplary embodiment of the present invention, the diffuser plate 420 may be initially provided in a curved shape and might not be flexible (e.g., rigid).

The diffuser plate 420 may receive light emitted from the light source unit 450 and may diffuse the light. For example, the diffuser plate 420 may act to increase uniformity in luminance of light produced by the light source unit 450. For example, the diffuser plate 420 may remove or reduce a bright spot, which may be visible on a front surface of a display device according to a position of the light source 451. The diffuser plate 420 may be spaced apart from the light source unit 450 by a predetermined distance with an air layer interposed therebetween.

The diffuser plate 420 may be fixed to the lower mold 320. The diffuser plate 420 may have a shape of, for example, a quadrangular plate which is similar to the display panel 200, but exemplary embodiments of the present invention are not limited thereto. In the case where LEDs are used as the light source 451, the diffuser plate 420 may be formed in various shapes including predetermined grooves, protrusions, or the like, according to a location of the light source 451.

While the diffuser plate 420 is described herein as a plate for ease of description, the diffuser plate 420 may be provided in the form of a sheet or film to achieve a slim display device. For example, the diffuser plate 420 may a plate or a film for guiding light.

The diffuser plate 420 may include a light-transmissive material, e.g., an acrylic resin such as polymethylmethacrylate (PMMA), polycarbonate (PC), or the like, to guide light efficiently.

The optical sheet 410 may be disposed on the diffuser plate 420. The optical sheet 410 may serve to diffuse and collimate light transmitted from the diffuser plate 420. The optical sheet 410 may be curved in the cross-sectional view of FIG. 2. The optical sheet 410 may include a flexible material, which is similar to the display panel 200. For example, the optical sheet 410 may initially have a shape that is substantially flat and may be deformed into a curved shape when finally included in a display device. In an exemplary embodiment of the present invention, the optical sheet 410 may be initially provided in a curved shape, and might not be flexible (e.g., rigid).

The optical sheet 410 may include a diffusion sheet, a prism sheet, and a protective sheet.

The diffusion sheet may diffuse light incident from the diffuser plate 420 to prevent the light from being partially concentrated.

The prism sheet may have triangular prisms on one surface thereof in a predetermined arrangement. The prism sheet may be disposed on the diffusion sheet to collimate light diffused by the diffusion sheet in a direction substantially perpendicular to the display panel 200.

The protective sheet may be disposed on the prism sheet to protect a surface of the prism sheet and to diffuse light to obtain uniformly distributed light.

The reflective sheet 430 may be disposed between the light source unit 450 and the bottom case 440, so that light emitted downwards from the diffuser plate 420 may be reflected towards the display panel 200, and thus, light efficiency may be increased. The reflective sheet 430 may be curved in the cross-sectional view of FIG. 2.

The reflective sheet 430 may include a wing portion that extends while forming an obtuse angle with the bottom surface of the reflective sheet 430. The bottom surface of the reflective sheet 430 may be placed on the bottom case 440 and the wing portion of the reflective sheet 430 may be disposed on the lower mold 320.

The reflective sheet 430 may include, for example, polyethylene terephthalate (PET) which imparts reflective properties, and one surface of the reflective sheet 430 may be coated with a diffusion layer containing, for example, titanium dioxide.

Meanwhile, the reflective sheet 430 may include a material containing a metal such as silver (Ag), or the like.

The bottom case 440 may accommodate the light source unit 450, the optical sheet 410, the reflective sheet 430, the diffuser plate 420, and the lower mold 320. The bottom case 440 may be curved in the cross-sectional view of FIG. 2.

The bottom case 440 may include a metal material having hardness such as stainless steel, or the like, or include a material having heat dissipation properties such as aluminum, an aluminum alloy, or the like. In this exemplary embodiment, the bottom case 440 may be configured to maintain a shape of a display device and to protect a variety of components disposed in the bottom case 440.

In the curved display device, as the display panel 200 is curved, stress may occur in the display panel 200. The stress may refer to forces that cause resistance or deformation in an object when an external force exerted on the object. Accordingly, a configuration to reduce the stress occurring as the display device is curved may be needed. Hereinafter, a coupling structure between the bottom case 400 and a curvature maintaining bar 460 for maintaining curvature will be described in detail with reference to FIGS. 3 to 5.

Figure 3:
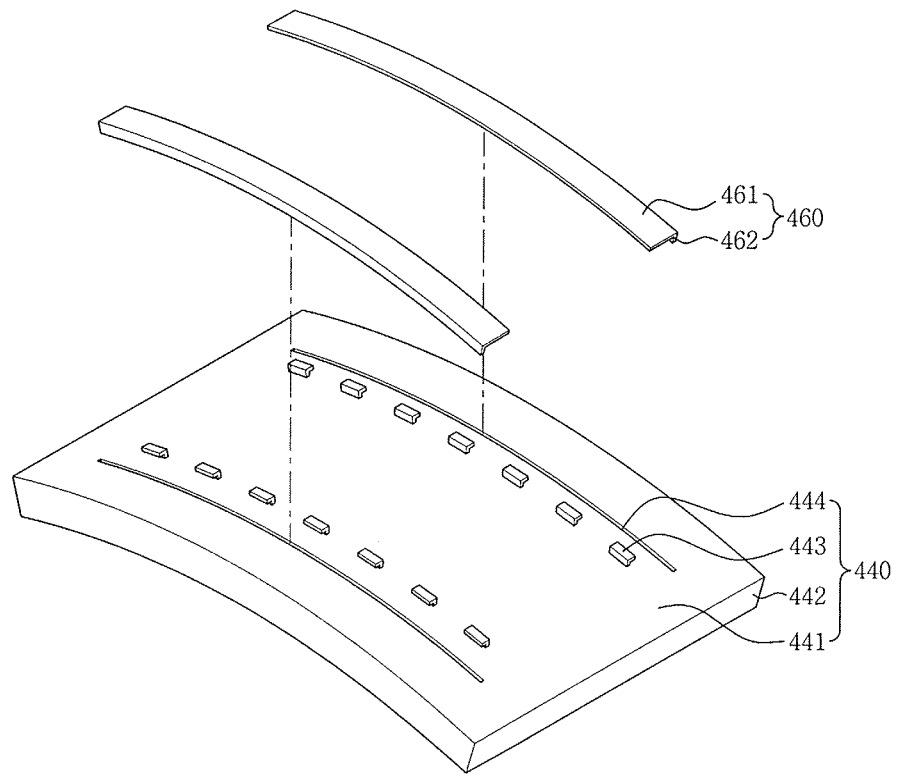
FIG. 3 is an exploded perspective view illustrating a curvature maintaining bar and a bottom case according to an exemplary embodiment of the present invention.
Figure 4:
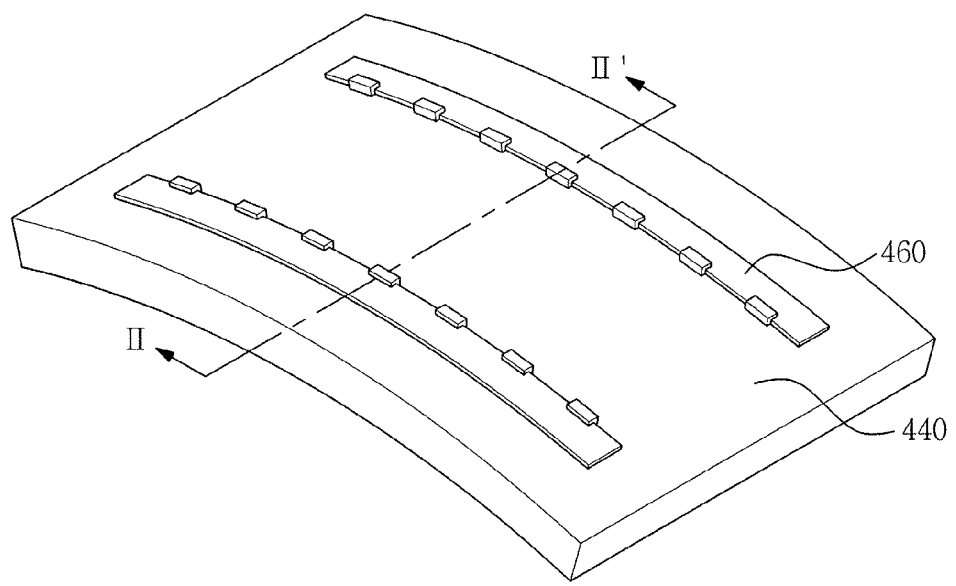
FIG. 4 is a coupled perspective view of the curvature maintaining bar and the bottom case of FIG. 3.
Figure 5:
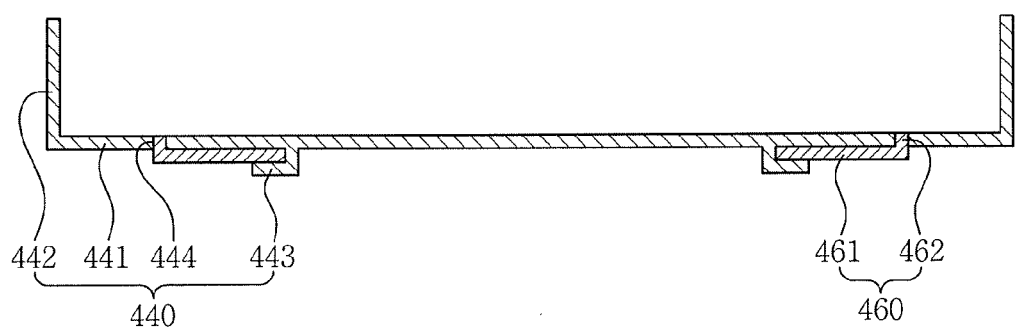
FIG. 5 is a cross-sectional view of a display device, which is taken along line II-II' of FIG. 4.

FIG. 3 is an exploded perspective view illustrating a curvature maintaining bar and a bottom case according to an exemplary embodiment of the present invention. FIG. 4 is a coupled perspective view of the curvature maintaining bar and the bottom case of FIG. 3. FIG. 5 is a cross-sectional view of a display device, which is taken along line II-II' of FIG. 4.

Referring to FIGS. 3 to 5, the bottom case 440 may include a bottom portion 441, a sidewall portion 442 bent from the bottom portion 441, a locking projection 443, and a coupling hole 444. The couple hole 444 may be defined in the bottom case 440. The bottom case 440 may have a predetermined curvature.

The bottom portion 441 may be disposed substantially parallel to the diffuser plate 420, the optical sheet 410, and the display panel 200. The sidewall portion 442 may extend from an edge portion of the bottom portion 441 in a direction substantially perpendicular thereto.

The locking projection 443 may extend from a surface of the bottom portion 441 and may fix the curvature maintaining bar 460 to the bottom case 440. The locking projection 443 may be integrated with the bottom portion 441 using double injection molding or insert injection molding. The locking projection 443 may have a hook shape.

The bottom portion 441 may have the coupling hole 444 into which a protrusion 462 of the curvature maintaining bar 460 is inserted. The coupling hole 444 defined in the bottom portion 441 may be disposed substantially parallel to a long or short side of the bottom case 440. The coupling hole 444 may be defined in a place corresponding to the protrusion 462 of the curvature maintaining bar 460.

In an exemplary embodiment according to the present invention, the locking projections 443 and the coupling holes 444 may be symmetrically disposed with respect to a central portion of the bottom portion 441 of the bottom case 440. Although the number of locking projections 443 and the number of coupling holes 444 are illustrated in FIG. 3, exemplary embodiments of the present invention are not limited thereto. The number of locking projections 443 and the number of coupling holes 444 may vary depending on a size of a display device and a purpose thereof.

The curvature maintaining bar 460 may be disposed on an exterior surface of a display device and may be configured to maintain a curvature of the display device. For example, the curvature maintaining bar 460 may have a predetermined curvature and may be in contact with the bottom portion 441 of the bottom case 440. In an exemplary embodiment of the present invention, the curvature maintaining bar 460 may have substantially the same curvature as the bottom case 440 and a surface contact may be made between the curvature maintaining bar 460 and the bottom portion 441. The curvature maintaining bar 460 may be press-fitted into the bottom case 440 and may serve to maintain a curvature of the display device.

The curvature maintaining bar 460 may be disposed substantially parallel to a long or short side of the bottom case 440. The number of curvature maintaining bars 460 may be two as illustrated in FIG. 3. In an exemplary embodiment of the present invention, when the curvature maintaining bar 460 may be disposed substantially parallel to the long side of the bottom case 440, the two curvature maintaining bars 460 may be respectively disposed at positions which are approximately ⅓ of a length of the short sides of the bottom case 440. In an exemplary embodiment of the present invention, when the curvature maintaining bar 460 may be disposed substantially parallel to the short side of the bottom case 440, the two curvature maintaining bars 460 may be respectively disposed at positions which are approximately ⅓ of a length of the long sides of the bottom case 440. In addition, the number of curvature maintaining bars 460 may vary depending on a size and a curvature of the bottom case 440. Further, the curvature maintaining bar 460 may have a smaller length than the long or short side of the bottom case 440.

The curvature maintaining bar 460 may include a base portion 461 and at least one protrusion 462.

The base portion 461 may be coupled to the locking projection 443. The base portion 461 may be in contact with the bottom portion 441 of the bottom case 440.

The protrusion 462 may protrude from a surface of the base portion 461. The protrusion 462 may be disposed along a length direction of the base portion 461 and may protrude in a direction substantially perpendicular to a surface of the base portion 461. The protrusion 462 may be inserted into the coupling hole 444 defined in the bottom case 440.

The base portion 461 of the curvature maintaining bar 460 may be coupled to the locking projection 443 of the bottom case 440 and the protrusion 462 may be inserted into the coupling hole 444 of the bottom case 440 so that the curvature maintaining bar 460 may be firmly fastened to the bottom case 440. A point contact may be made between a curvature maintaining bar and the bottom case 440 by screws. A surface contact may be made between the curvature maintaining bar 460 according to an exemplary embodiment of the present invention and the bottom case 440, and thus, the curvature maintaining bar 460 may maintain a curvature of a display device with increased reliability. Further, the curvature maintaining bar 460 may be press-fitted into the bottom case 440 instead of using a screw to decrease the number of components and to simplify an assembly process.

While an exemplary embodiment of the present invention in which a direct-type backlight unit is used in a display device has been described above, the present invention is not limited thereto. According to an exemplary embodiment of the present invention, various types of backlight units such as an edge-type backlight unit, or the like may be used in a display device. Further, in an exemplary embodiment of the present invention, the display device may be an LCD, but the display device may be a variety of curved display devices for displaying an image. For example, the curvature maintaining bar 460 and the bottom case 440 according to an exemplary embodiment of the present invention may be applied to a variety of curved display devices for displaying an image.

Figure 6:
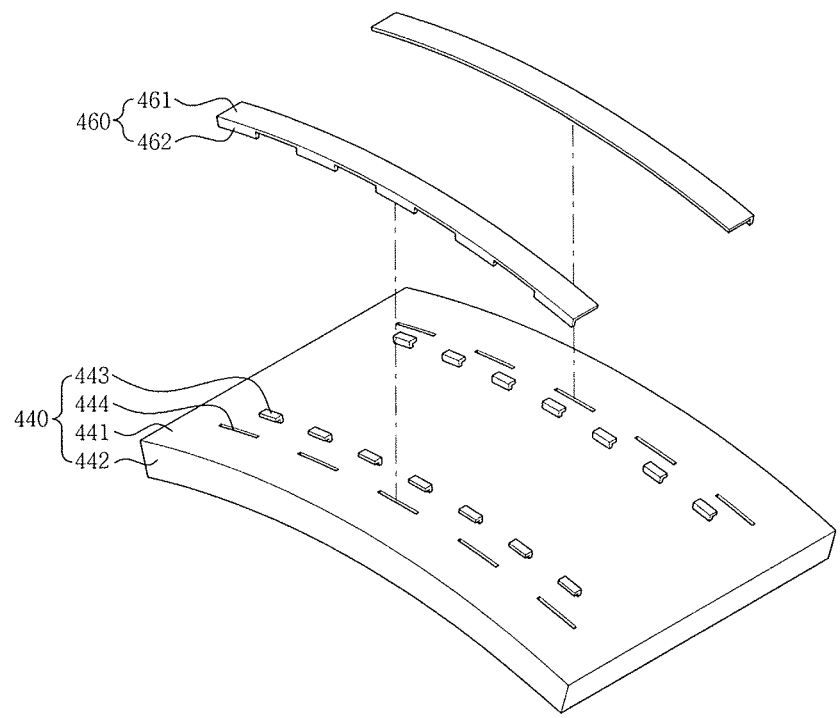
FIG. 6 is an exploded perspective view illustrating a curvature maintaining bar and a bottom case according to an exemplary embodiment of the present invention.
Figure 7:
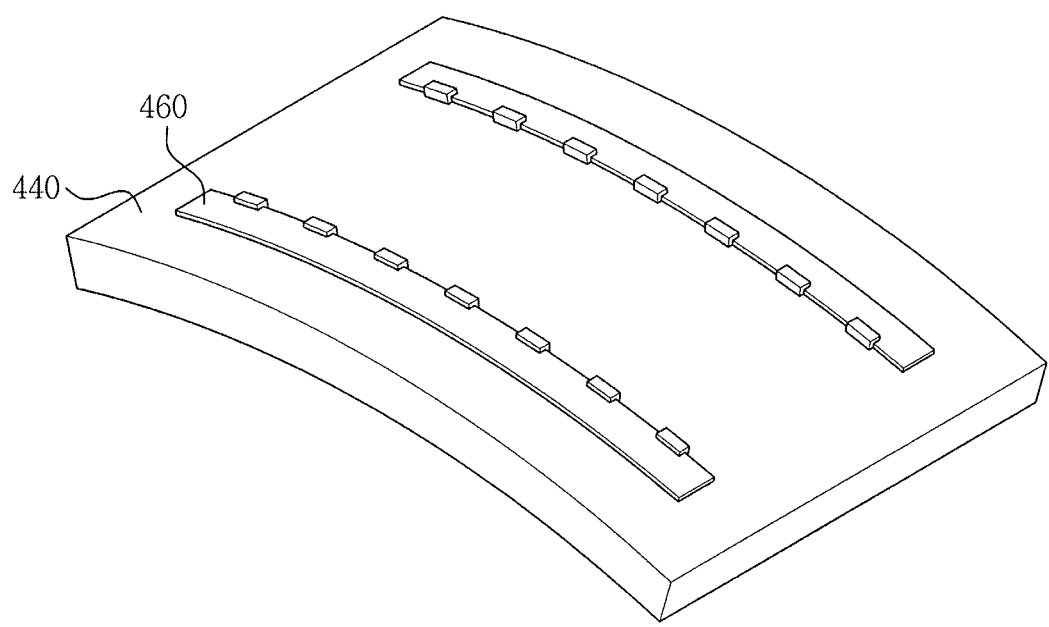
FIG. 7 is a coupled perspective view of the curvature maintaining bar and the bottom case of FIG. 6.

FIG. 6 is an exploded perspective view illustrating a curvature maintaining bar and a bottom case according to an exemplary embodiment of the present invention. FIG. 7 is a coupled perspective view of the curvature maintaining bar and the bottom case of FIG. 6. Duplicate description on the same configuration of FIGS. 1 to 3 and FIGS. 6 and 7 will not be repeated for brevity.

Referring to FIGS. 6 and 7, the curvature maintaining bar 460 according to an exemplary embodiment includes a plurality of protrusions 462. The bottom case 440 may have a plurality of coupling holes 444. Each of the coupling holes 444 may be disposed in a place corresponding to each protrusion 462. Each of the protrusions 462 may have a variety of shapes in consideration of a curvature and a level of process difficulty of the bottom case 440.

Figure 8:
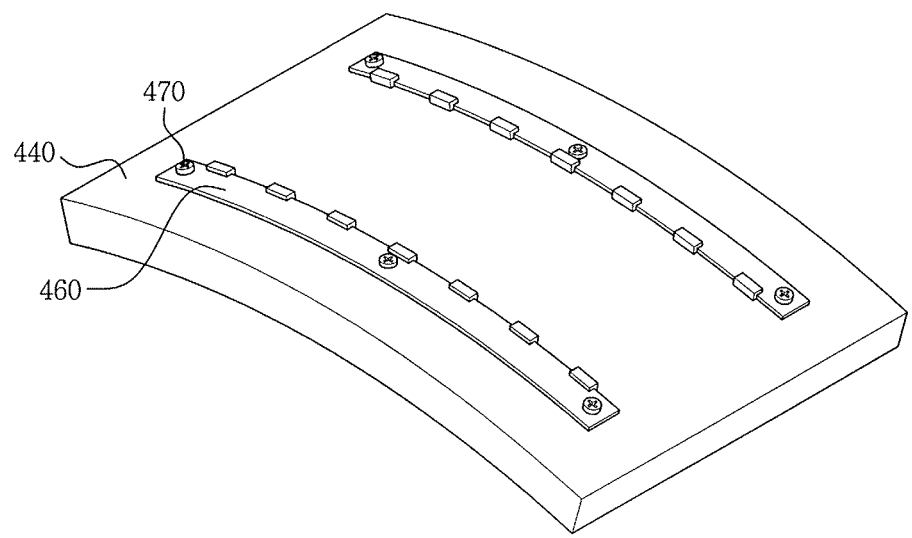
FIG. 8 is a coupled perspective view illustrating a curvature maintaining bar and a bottom case according to an exemplary embodiment of the present invention.

FIG. 8 is a coupled perspective view illustrating a curvature maintaining bar and a bottom case according to an exemplary embodiment of the present invention.

Referring to FIG. 8, the curvature maintaining bar 460 according to an exemplary embodiment may be firmly fastened to the bottom case 440 by means of a screw 470. A coupling force between the curvature maintaining bar 460 and the bottom case 440 may be increased because of the screw 470.

Figure 9:
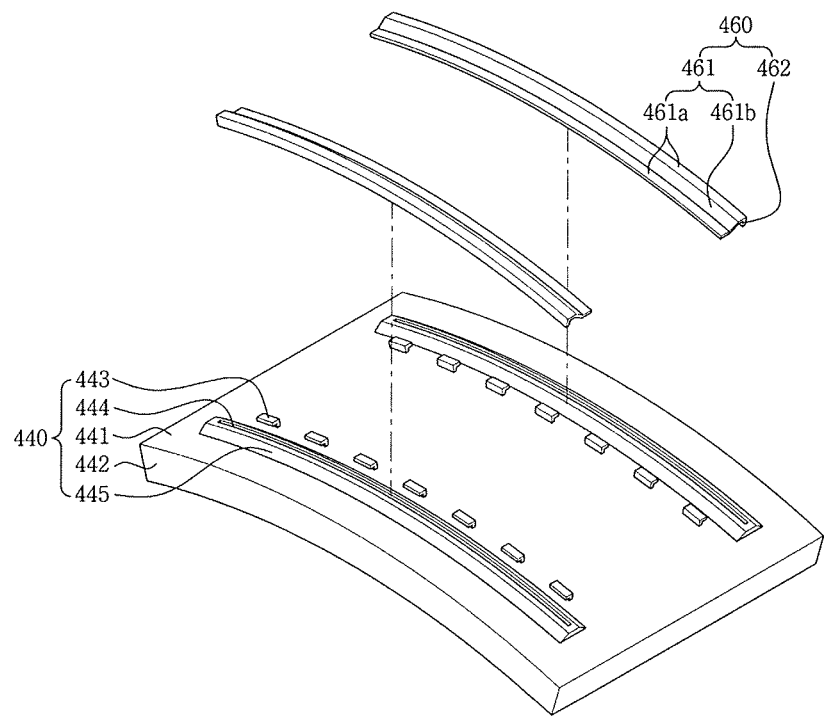
FIG. 9 is an exploded perspective view of a curvature maintaining bar and a bottom case according to an exemplary embodiment of the present invention.
Figure 10:
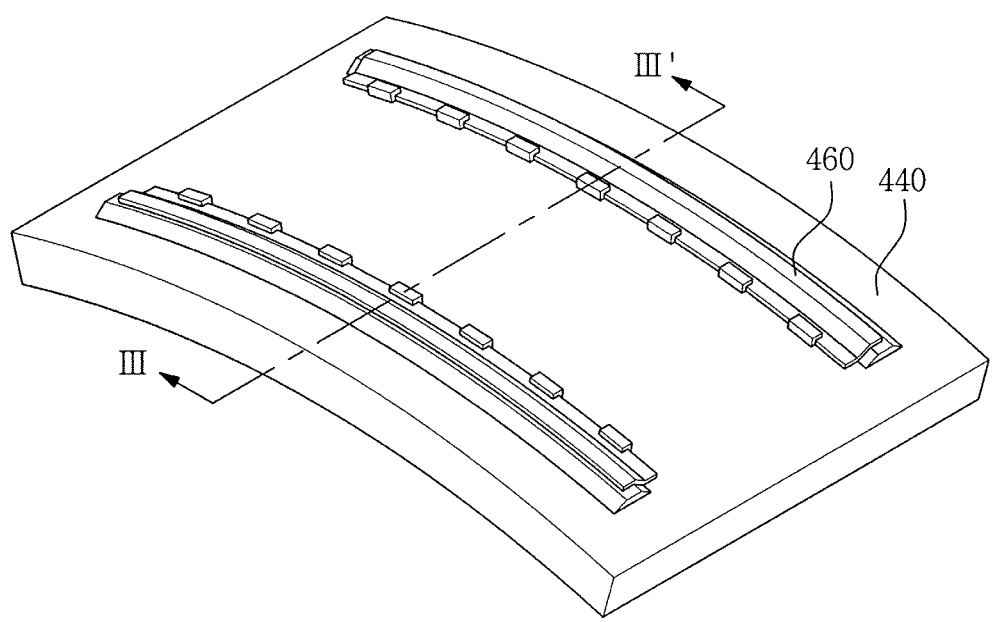
FIG. 10 is a coupled perspective view illustrating the curvature maintaining bar and the bottom case of FIG. 9.
Figure 11:
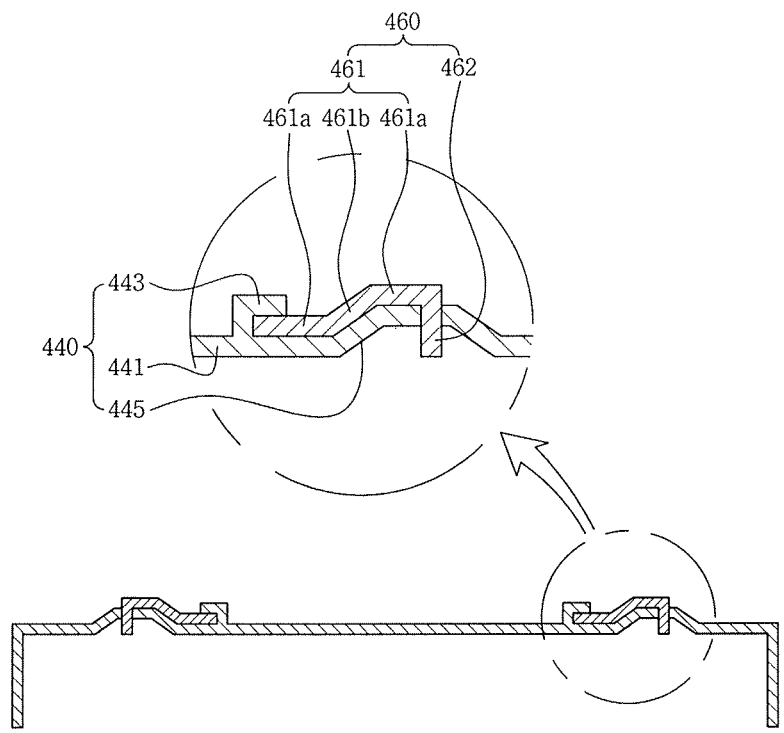
FIG. 11 is a cross-sectional view of a display device, which is taken along line III-III' of FIG. 10.

FIG. 9 is an exploded perspective view of a curvature maintaining bar and a bottom case according to an exemplary embodiment of the present invention. FIG. 10 is a coupled perspective view illustrating the curvature maintaining bar and the bottom case of FIG. 9. FIG. 11 is a cross-sectional view of a display device, which is taken along line III-III' of FIG. 10. Duplicate description on the same configuration of FIGS. 1 to 3 and FIGS. 8 and 11 will not be repeated for brevity.

Referring to FIGS. 9 to 11, the curvature maintaining bar 460 according to an exemplary embodiment of the present invention includes the base portion 461 that is at least partially curved, and the bottom case 440 according to an exemplary embodiment of the present invention includes a guide portion 445 bent from the bottom portion 441.

The base portion 461 of the curvature maintaining bar 460 may include a first part 461a and a second part 461b. The first part 461a may be located substantially parallel to the bottom portion 441 of the bottom case 440, and the second part 461b may form an obtuse angle with the first part 461a.

The guide portion 445 of the bottom case 440 may be integrated with the bottom portion 441 using double injection molding or insert injection molding. For example, the guide portion 445 may be integrated with the bottom portion 441 and may be bent from a surface of the bottom portion 441. The guide portion 445 may form an acute angle with the bottom portion 441 and may be in contact with the base portion 461 of the curvature maintaining bar 460. Further, the guide portion 445 may have the coupling hole 444 into which the protrusion 462 is inserted.

A coupling force between the curvature maintaining bar 460 and the bottom case 440 may be increased because the bottom case 440 includes the guide portion 445.

Figure 12:
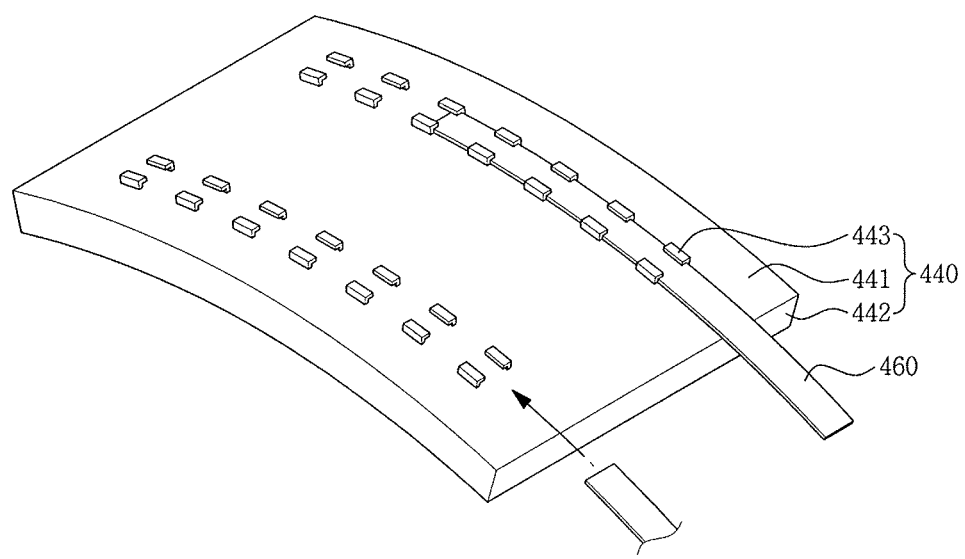
FIG. 12 is an exploded perspective view of a curvature maintaining bar and a bottom case according to an exemplary embodiment of the present invention.
Figure 13:
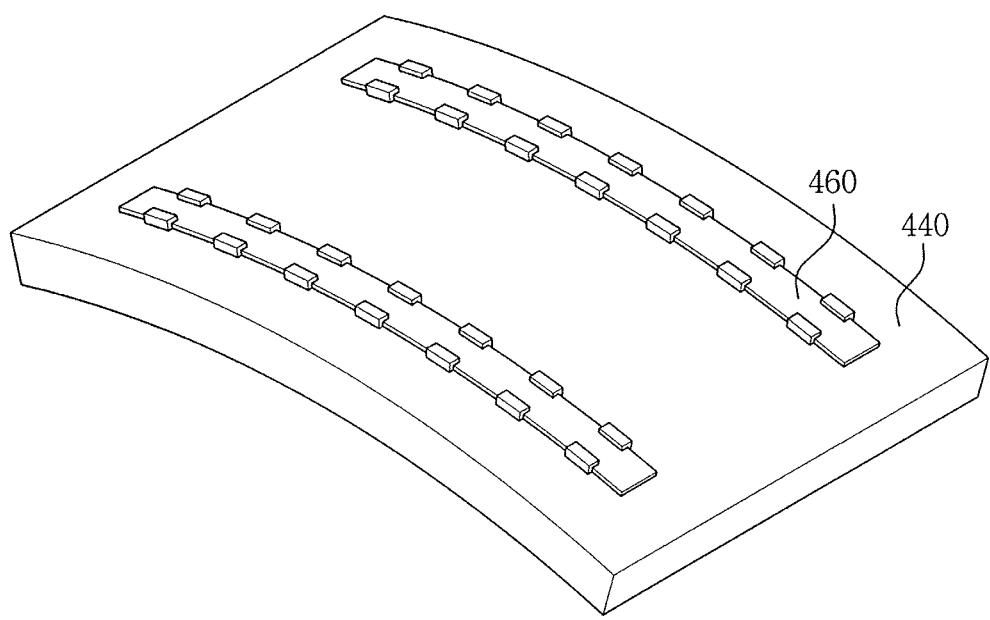
FIG. 13 is a coupled perspective view illustrating the curvature maintaining bar and the bottom case of FIG. 12.

FIG. 12 is an exploded perspective view of a curvature maintaining bar and a bottom case according to an exemplary embodiment of the present invention. FIG. 13 is a coupled perspective view of the curvature maintaining bar and the bottom case of FIG. 12.

Referring to FIGS. 12 and 13, the curvature maintaining bar 460 according to an exemplary embodiment of the present invention is coupled in a sliding manner to the locking projection 443 of the bottom case 440. The curvature maintaining bar 460 might not exclude the protrusion 462 and may include only the base portion 461. The locking projection 443 may be provided in plural along left and right sides of the curvature maintaining bar 460. Where the curvature maintaining bar 460 and the bottom case 440 are provided as described above, manufacturing and coupling processes of the curvature maintaining bar 460 and the bottom case 440 may be simplified, and thus, process efficiency may be increased.

Accordingly, the curvature maintaining bar 460 and the bottom case 440 may be provided in various shapes in consideration of coupling forces between the curvature maintaining bar 460 and the bottom case 440 and process efficiency.

The foregoing is illustrative of exemplary embodiments of the present invention and the present invention should not be construed as being limited to the exemplary embodiments disclosed herein. Although a few exemplary embodiments thereof have been described, it will be understood that various modifications in forms and detail may be made without departing from the scope and spirit of the present invention.

What is claimed is:

1. A display device comprising:
    a display panel having a first curvature;
    a bottom case in which the display panel is disposed, the bottom case comprising a locking projection, a bottom portion, a sidewall portion bent from the bottom portion and a second curvature having substantially a same shape or radius as that of the first curvature; wherein the locking projection extends from a surface of the bottom portion; and
    a curvature maintaining bar coupled to the locking projection, the curvature maintaining bar comprising a first protrusion,
    wherein the bottom portion of the bottom case has a coupling hole into which the first protrusion is inserted.

2. The display device of claim 1, wherein the curvature maintaining bar has a third curvature having substantially the same shape or radius as that of the first curvature, the curvature maintaining bar being in contact with the bottom portion.

3. The display device of claim 2, wherein the curvature maintaining bar further comprises a base portion, and
    wherein the first protrusion protrudes from a surface of the base portion.

4. The display device of claim 3, wherein the base portion is coupled to the locking projection.

5. The display device of claim 3, wherein the base portion is in contact with the bottom portion of the bottom case.

6. The display device of claim 2, wherein the curvature maintaining bar further comprises a base portion, and
    wherein the bottom case further comprises a guide portion bent from the bottom portion.

7. The display device of claim 6, wherein the guide portion is in contact with the base portion, the guide portion having the coupling hole.

8. The display device of claim 7, wherein the bottom portion and the guide portion are integrated with each other.

9. The display device of claim 1, wherein the curvature maintaining bar is disposed substantially parallel to a long side or a short side of the bottom case.

10. The display device of claim 1, further comprising a screw configured to fasten the curvature maintaining bar to the bottom portion of the bottom case.

11. A display device comprising:
    a display panel having a first curvature;
    a bottom case in which the display panel is disposed, the bottom case comprising a locking projection, a guide portion bent from a bottom portion of the bottom case, and a second curvature having substantially a same shape or radius as that of the first curvature;
    wherein the locking projection extends from a surface of the bottom portion; and
    a curvature maintaining bar coupled to the locking projection, the curvature maintaining bar comprising a first protrusion and a base portion,
    wherein the guide portion is in contact with the base portion and the guide portion has a coupling hole into which the first protrusion is inserted.

12. The display device of claim 11, wherein the locking projection has a hook shape.

13. The display device of claim 11, wherein the curvature maintaining bar is disposed substantially parallel to a long side or a short side of the bottom case.

14. The display device of claim 13, wherein the locking projection extends from a surface of the bottom portion.

* * * * *